US010622529B2

(12) United States Patent
Okahisa

(10) Patent No.: US 10,622,529 B2
(45) Date of Patent: Apr. 14, 2020

(54) LIGHT EMITTING DEVICE

(71) Applicant: NICHIA CORPORATION, Anan-shi, Tokushima (JP)

(72) Inventor: Tsuyoshi Okahisa, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 16/138,536

(22) Filed: Sep. 21, 2018

(65) Prior Publication Data
US 2019/0027663 A1    Jan. 24, 2019

Related U.S. Application Data

(63) Continuation of application No. 14/468,755, filed on Aug. 26, 2014, now Pat. No. 10,109,779.

(30) Foreign Application Priority Data

Aug. 29, 2013   (JP) .................................. 2013-177773

(51) Int. Cl.
*H01L 33/50*      (2010.01)
*H01L 33/60*      (2010.01)
(Continued)

(52) U.S. Cl.
CPC .............. *H01L 33/60* (2013.01); *H01L 24/97* (2013.01); *H01L 33/502* (2013.01);
(Continued)

(58) Field of Classification Search
CPC ....... H01L 33/48; H01L 33/483; H01L 33/50; H01L 33/505; H01L 33/507; H01L 33/52; H01L 33/54; H01L 33/58; H01L 33/60
See application file for complete search history.

(56) References Cited

U.S. PATENT DOCUMENTS

2004/0046242 A1 *  3/2004  Asakawa ............ H01L 31/0203
                                                         257/678
2005/0242355 A1    11/2005  Guenther et al.
(Continued)

FOREIGN PATENT DOCUMENTS

DE    10 2008 049 399 A1    4/2010
EP         1 592 074 A2     11/2005
(Continued)

OTHER PUBLICATIONS

European Search Report Application No. 14182481.3 dated Feb. 2, 2015. submitted in parent U.S. Appl. No. 14/468,755.
(Continued)

*Primary Examiner* — Jae Lee
(74) *Attorney, Agent, or Firm* — Squire Patton Boggs (US) LLP

(57) ABSTRACT

A light emitting device includes a base member including a resin-molded body having an upper surface, a lower surface and a front surface, and formed with a groove-shaped recess in the front surface across the front surface from the upper surface to the lower surface. A lead can be embedded in the resin-molded body. A light emitting element is provided, and can include a light emitting element chip and a reflecting layer limiting a light-emitting region to a predetermined range. The reflecting layer can be disposed on or over a side surface of the light emitting element. The light emitting element is disposed on a bottom surface of the recess such that the reflecting layer is spaced apart from a side wall of the recess.

15 Claims, 3 Drawing Sheets

(51) Int. Cl.
*H01L 33/62* (2010.01)
*H01L 23/00* (2006.01)
*H01L 33/54* (2010.01)
*H01L 33/48* (2010.01)

(52) U.S. Cl.
CPC .......... *H01L 33/505* (2013.01); *H01L 33/54* (2013.01); *H01L 33/62* (2013.01); *H01L 33/486* (2013.01); *H01L 2224/73253* (2013.01); *H01L 2924/12041* (2013.01); *H01L 2924/15788* (2013.01)

(56) References Cited

U.S. PATENT DOCUMENTS

| | | |
|---|---|---|
| 2007/0164408 A1 | 7/2007 | Yeh et al. |
| 2008/0043477 A1 | 2/2008 | Yamamoto et al. |
| 2008/0191609 A1 | 8/2008 | Schmidt et al. |
| 2008/0210966 A1 | 9/2008 | Sakamoto et al. |
| 2009/0315068 A1 | 12/2009 | Oshio et al. |
| 2010/0140648 A1 | 6/2010 | Harada et al. |
| 2010/0202131 A1 | 8/2010 | Kim et al. |
| 2011/0018017 A1 | 1/2011 | Bierhuizen et al. |
| 2011/0031525 A1 | 2/2011 | Nemoto et al. |
| 2011/0031874 A1 | 2/2011 | Hosokawa et al. |
| 2011/0175127 A1 | 7/2011 | Kanada et al. |
| 2012/0236582 A1 | 9/2012 | Waragaya et al. |
| 2015/0155426 A1 | 6/2015 | Joen et al. |

FOREIGN PATENT DOCUMENTS

| | | |
|---|---|---|
| EP | 2 315 263 A1 | 4/2011 |
| JP | 2008-141145 A | 6/2008 |
| JP | 2008-187030 A | 8/2008 |
| JP | 2008-235469 A | 10/2008 |
| JP | 2008-252137 A | 10/2008 |
| JP | 2010-003743 A | 1/2010 |
| JP | 2012-533902 A | 12/2012 |
| JP | 2013-012544 A | 1/2013 |
| JP | 2013077679 A | 4/2013 |
| KR | 20080089058 A | 10/2008 |
| WO | 2009/ 075530 A2 | 6/2009 |

OTHER PUBLICATIONS

European Office Action dated Oct. 10, 2016, issued in corresponding EP Application No. 14 182 481.3. submitted in parent U.S. Appl. No. 14/468,755.

* cited by examiner

LIGHT EMITTING DEVICE

CROSS-REFERENCE TO RELATED APPLICATIONS

This application is a continuation of U.S. patent application Ser. No. 14/468,755 filed on Aug. 26, 2014, which claims priority of Japanese Patent Application No. 2013-177773, filed on Aug. 29, 2013. The entire disclosure of these earlier applications are hereby incorporated herein by reference.

BACKGROUND

1. Field

The disclosure relates to a light emitting device.

2. Description of the Related Art

A light emitting device employing a light emitting diode has been widely used as a backlight source for an image display device. One example of a light emitting device as a backlight source for an image display device is provided with a light guide plate and a light emitting device disposed on a side surface of the light guide plate, and configured to emit light emitted from the light emitting device through a light-emitting surface of the light guide plate. Further, as a light emitting device used as a backlight source for an image display device used for a mobile terminal, a side-view type (side surface emission type) light emitting device, as disclosed in JP2010-3743 A, in which a mounting surface and a light-emitting surface are perpendicular to each other and its side surface constitutes a light extracting surface has been widely used. Such a light emitting device as a backlight source for an image display device used for a mobile terminal is required to be capable of efficiently extracting light from the light emitting element to a front side, as well as to be small, lightweight, and thin.

As mobile terminals become thinner, even thinner side-view type light emitting devices have become demanded.

SUMMARY

Thus, an object of the present invention is to provide a small and thin side-view type light emitting device capable of efficiently extracting light from a light emitting element to a front side.

In order to achieve the above object, a light emitting device according to an embodiment of the present invention can include a base member comprising a resin-molded body having an upper surface, a lower surface, and a front surface having a recess formed in a groove-shaped from the upper surface to the lower surface. A lead can be embedded in the resin-molded body. A light emitting element can be included, having a light emitting element chip and a reflecting layer limiting a light-emitting region to a predetermined range. The reflecting layer can be disposed on or over a side surface of the light emitting element. The light emitting element is disposed on a bottom surface of the recess.

According to the light emitting device thus configured, it is possible to provide a small and thin side-view type light emitting device capable of efficiently extracting light from the light emitting element to a front side.

DETAILED DESCRIPTION

Hereinafter, a light emitting device of embodiments of the present invention will be described with reference to the drawings.

Figure 1:
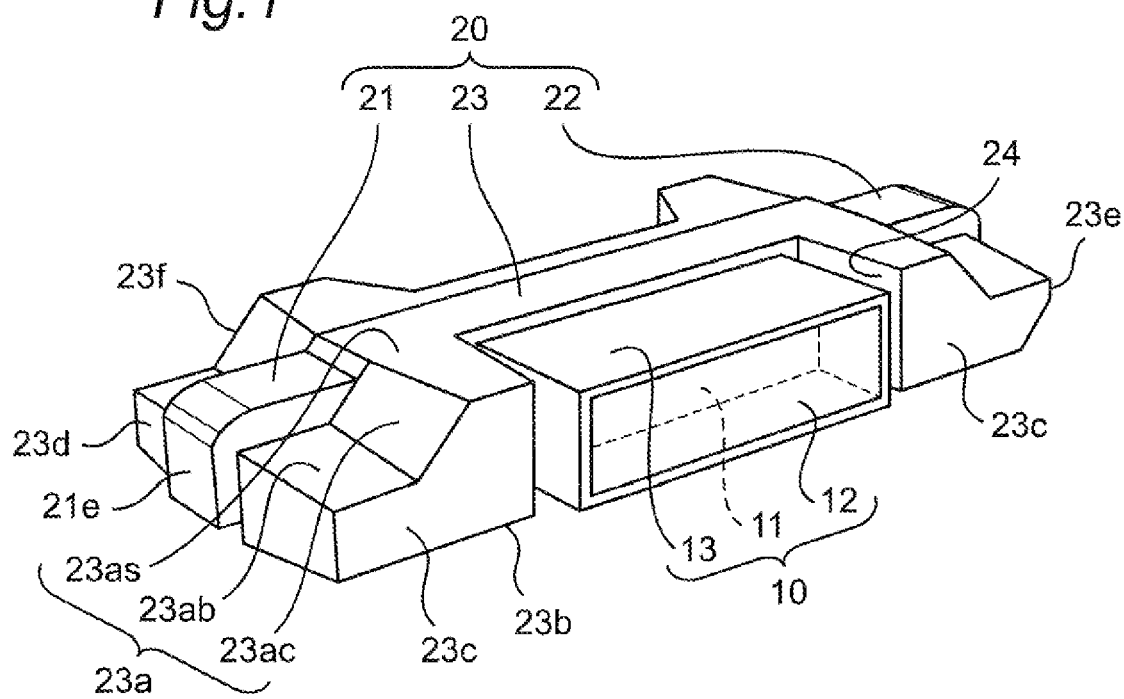
FIG. 1 is a perspective view showing a configuration of a light emitting device of an embodiment according to the present invention.
Figure 2:
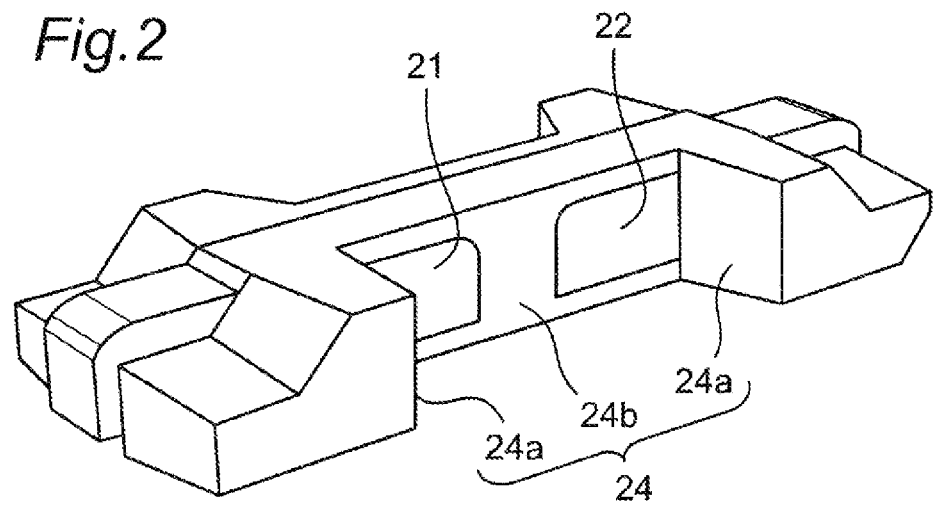
FIG. 2 is a perspective view showing a front surface side of a base member 20 of the embodiment.

FIG. 1 is a perspective view showing a configuration of the light emitting device of an embodiment of the present invention. FIG. 2 is a perspective view showing a configuration of a base member 20 with a first surface 23a as a mounting surface upward.

Referring to FIG. 1, the light emitting device can include the base member 20 having a recess 24, and a light emitting element 10 disposed on a bottom surface 24b of the recess in the base member 20.

Base Member 20

The base member 20 includes a resin-molded body 23, and a first lead 21 and a second lead 22 that are embedded in the resin-molded body 23.

The resin-molded body 23 includes the first surface 23a which is one of two opposing main surfaces, a second surface 23b which is the other of the two opposing main surfaces, a front surface 23c, a rear surface 23f, a first end surface 23d, and a second end surface 23e, as well as the groove-shaped recess 24 in the front surface 23c. As described above, in FIG. 1 and other drawings, the first surface 23a as a mounting surface is shown upside. Accordingly, in a mounted state, the first surface 23a corresponds to a lower surface and the second surface 23b corresponds to an upper surface. The recess 24 is formed in the front surface 23c across the front surface 23c so as to penetrate from the first surface 23a to the second surface 23b, and includes the bottom surface 24b of the recess and two side walls 24a. The side walls 24a of the recess are preferably inclined such that an opening side of the recess is greater than the recess bottom surface 24b. Mounting of the light emitting element may be facilitated by making the opening side greater.

According to the resin-molded body 23, the first surface 23a includes a stepped portion on each of a side of the first end surface 23d and a side of the second end surface 23e, and the resin-molded body 23 becomes thin at the stepped portion. In the first surface 23a, a part excluding inclined surfaces 23ac and flat surfaces 23ab that are continuous from the corresponding inclined surfaces 23ac that constitute the stepped portions on the side of the first end surface 23d and the side of the second end surface 23e is referred to as a mount surface 23 as.

Examples of a material for molding the resin-molded body 23 can include a thermoplastic resin and a thermosetting resin, and more specifically, resins such as polyphthalamide (PPA), a polycarbonate resin, polyphenylenesulfide (PPS), liquid crystal polymer (LCP), an ABS resin, an epoxy resin, a phenolic resin, an acrylic resin, and a PBT resin. Further, it is possible to improve reflectance of light on the surface of the resin-molded body by mixing a light-reflective material such as titanium oxide into the material for molding. With this, it is possible to cause returning light to be efficiently reflected.

Figure 3:
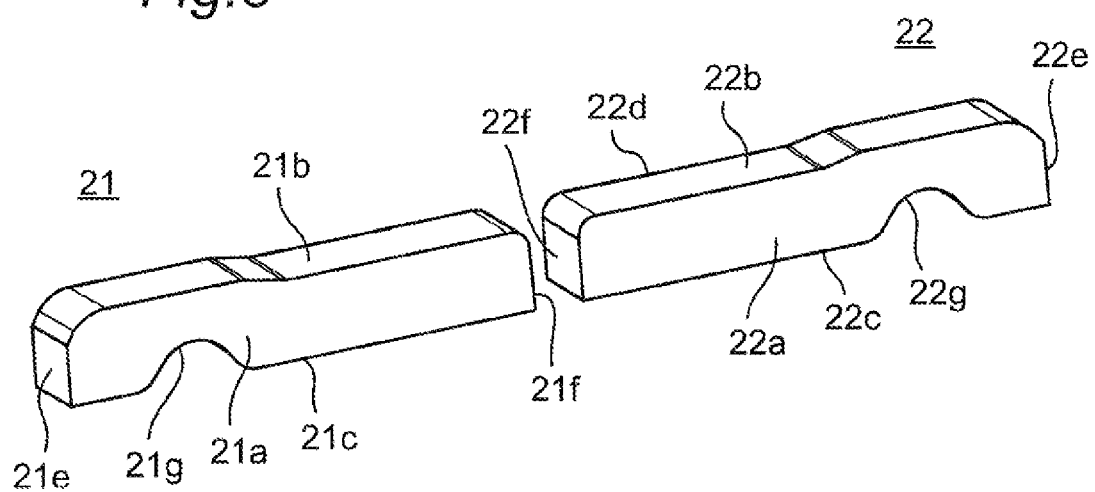
FIG. 3 is a perspective view showing a configuration of a first lead and a second lead embedded in the base member of the embodiment.

As illustrated in FIG. 3, the first lead 21 includes one end surface 21e and the other end surface 21f. The first lead 21 is formed in a pillar shape of a substantial hexahedron elongated in a direction from the one end surface 21e to the other end surface 21f. The first lead 21 includes four side surfaces 21a, 21b, 21c, and 21d between the one end surface 21e and the other end surface 21f. FIG. 3 shows the first lead 21 and the second lead 22 with their positional relation within the resin-molded body 23 maintained.

The first lead 21 is embedded in the resin-molded body 23 such that the one end surface 21e is exposed at a central portion of the first end surface 23d of the resin-molded body 23, and a part of the side surface 21b on a side of the one end surface 21e is exposed from the inclined surface 23ac and the flat surface 23ab of the first surface 23a of the resin-molded body 23. A part of the side surface 21a of the first lead 21 on a side of the other end surface 21f is exposed at the bottom surface 24b of the recess of the resin-molded body 23. A recess 21g is provided in the side surface 21c of the first lead 21, and the recess prevents the first lead 21 from falling out of the resin-molded body 23.

As illustrated in FIG. 3, the second lead 22 includes one end surface 22e and the other end surface 22f. The second lead 22 is formed in a pillar shape of substantial hexahedron elongated in a direction from the one end surface 22e to the other end surface 22f. The second lead 22 includes four side surfaces 22a, 22b, 22c, and 22d between the one end surface 22e and the other end surface 22f.

As illustrated in FIG. 1, the second lead 22 is embedded in the resin-molded body 23 such that the one end surface 22e is exposed at a central portion of the second end surface 23e of the resin-molded body 23, and a part of the side surface 22b on a side of the one end surface 22e is exposed from the inclined surface 23ac and the flat surface 23ab of the first surface 23a of the resin-molded body 23. A part of the side surface 22a of the second lead 22 on a side of the other end surface 22f is exposed at the bottom surface 24b of the recess of the resin-molded body 23. A recess 22g is provided in the side surface 22c of the second lead 22, and the recess prevents the second lead 22 from falling out of the resin-molded body 23.

According to the light emitting device of this embodiment, the first lead 21 is embedded in the resin-molded body 23 such that the part of the side surface 21b on the side of the one end surface 21e is exposed from the resin-molded body 23, and the second lead 22 is embedded in the resin-molded body 23 such that the part of the side surface 22b on the side of the one end surface 22e is exposed from the resin-molded body 23. However, the present invention is not limited to such an example, and the first lead 21 and the second lead 22 may be embedded in the resin-molded body 23 such that, for example, the side surface 21b on the side of the other end surface 21f and the side surface 22b on the side of the other end surface 22f are exposed while positioned in the same plane as the mount surface 23as. Alternatively, the first lead 21 and the second lead 22 may be embedded in the resin-molded body 23 such that the side surface 21b on the side of the other end surface 21f and the side surface 22b on the side of the other end surface 22f are exposed while extending from the mount surface 23as.

As illustrated in FIG. 3, in some embodiments of the present invention, each of the first lead 21 and the second lead 22 is formed in a pillar shape of substantial hexahedron elongated in one direction. The part of the side surface 21a on the side of the other end surface 21f is exposed at the bottom surface 24b of the recess, and the part on the side of the one end surface 21e of the side surface 21b that is perpendicular to the side surface 21a is constituted as a main external connection surface for connecting to an external circuit. The part of the side surface 22a on the side of the other end surface 22f is exposed at the bottom surface 24b of the recess, and the part on the side of the one end surface 22e of the side surface 22b that is perpendicular to the side surface 22a is constituted as a main external connection surface for connecting to an external circuit.

In this manner, according to some embodiments of the present invention, by forming each of the first lead 21 and the second lead 22 in a pillar shape of substantial hexahedron, it is possible to use one of the two side surfaces that are perpendicular to each other for connection with the light emitting element 10, and the other of the two side surfaces as the external connection surface, and thus to improve heat radiation characteristics.

The first lead and the second lead may be made of a conductive material including at least one of aluminum, iron, nickel, copper, a copper alloy, stainless steel, and a ferro-alloy including Invar alloy, for example. A clad material having a cladding of different types of metals may also be used. Further, it is preferable that a surface of a lead frame be plated by gold, silver, nickel, palladium, or an alloy of these metals Moreover, a thickness of the lead frame is, for example, from 50 μm to 1000 μm, and preferably, from 100 μm to 500 μm. In addition, the thickness of the lead frame may be changed depending on the purpose. It is possible to change the thickness of the lead frame by etching (half etching) or press working.

The base member 20 thus configured may be manufactured in the following manner, for example.

First, a mold having a cavity corresponding to the shape of the resin-molded body 23 is prepared. Then, two columnar leads that are to be the first lead 21 and the second lead 22 are positioned in the cavity and fixed at a predetermined distance between their ends. The ends of the columnar leads positioned at the predetermined distance respectively correspond to the other end surface 21f and the other end surface 22f illustrated in FIG. 3.

For example, the mold is configured by two or more molds that are separable, and one of the molds includes a projection corresponding to the recess 24, and the other of the molds includes a gate for injecting a resin.

Next, a resin is injected into the cavity in which the first lead 21 and the second lead 22 are fixed, and the resin is hardened.

After hardening the resin, the resin-molded body is taken out of the mold, and the columnar leads that extend outside the resin-molded body 23 are cut.

The columnar first lead 21 and the columnar second lead 22 are cut along the first end surface 23d and the second end surface 23e (parallelly) such that the ends on the side of the one end surface 21e and the one end surface 22e project from the resin-molded body 23 by a predetermined length. In this manner, the one end surfaces 21e and 22e respectively constituted by cutting surfaces are provided. The one end surface 21e constituted by the cutting surface is preferably perpendicular to the four side surfaces 21a, 21b, 21c, and 21d, and the one end surface 22e constituted by the cutting surface is preferably perpendicular to the four side surfaces 22a, 22b, 22c, and 22d.

Figure 4:
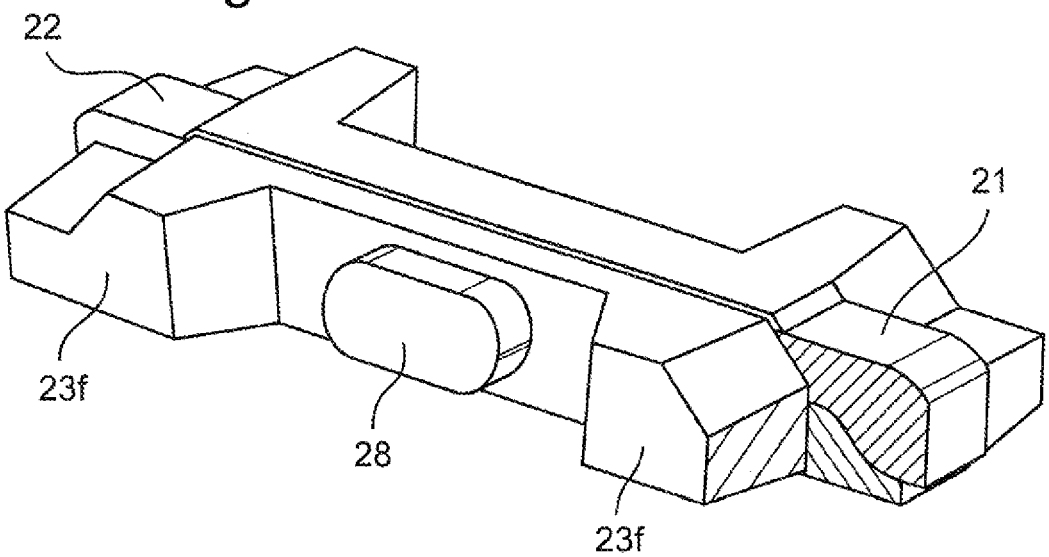
FIG. 4 is a perspective view showing a rear surface side of the base member 20 of the embodiment.

In FIG. 4, a portion represented by 28 is a gate trace of the resin-molded body 23.

The base member 20 thus configured is provided with the recess 24 housing the light emitting element so as to penetrate from the first surface 23a to the second surface 23b, and its thickness (a distance between the first surface 23a and the second surface 23b) may be thin as there is no walls on the side of the first surface 23a and on the side of the second surface 23b (hereinafter, referred to as upper and lower walls).

However, as the recess 24 has no upper and lower walls, light from the light emitting element may leak from the side of the first surface 23a and the side of the second surface 23b, and it is not possible to efficiently extract light emitted from the light emitting element to a front side.

Therefore, embodiments of the present invention realize a thin light emitting device capable of efficiently extracting light from the light emitting element to the front side, by using a light emitting element having a reflecting layer provided on the side surfaces.

Light Emitting Element 10

Examples of the light emitting element 10 can include a light emitting element chip 11, a light transmissive member 12 disposed on a light-emitting surface of the light emitting element chip 11, and a reflecting layer 13 covering an periphery of the light emitting element chip 11 and an periphery of the light transmissive member 12. The light emitting element 10 can be configured such that a side surface of a quadrangular prismatic body defined by a chip mounting surface of the light emitting element chip 11 on which a positive electrode 3a and a negative electrode 3b are provided, an upper surface of the light transmissive member 12, and side surfaces that are perpendicular to the upper surface and the chip mounting surface are covered by the reflecting layer 13, and an outer shape of the light emitting element 10 including the reflecting layer 13 is also in a quadrangular prismatic body. Hereinafter, the quadrangular prismatic body excluding the reflecting layer 13 is referred to as an inner quadrangular prismatic body, and the quadrangular prismatic body including the reflecting layer 13 is referred to as an outer quadrangular prismatic body. According to embodiments of the present invention, the shape of the light emitting element 10 is not limited to quadrangular prismatic body, but manufacturing of the light emitting element 10 is facilitated when the shape of the light emitting element 10 is a quadrangular prismatic body. In the following, one example of a method of manufacturing the light emitting element 10 will be described.

Preparation of Light Emitting Element Chip

The light emitting element chip 11 having the positive electrode 3a and the negative electrode 3b on the same surface is prepared.

The light emitting element chip 11 may be any light emitting element as long as a light-emitting layer made of semiconductor is provided. In particular, a light emitting element having a light-emitting layer made of nitride semiconductor, especially gallium nitride-based compound semiconductor (particularly InGaN) may be suitably combined with a phosphor, as this type of light emitting element is able to emit intense light in a short wavelength region and a near-ultraviolet region in a visual light range. Desirably, a light emission peak wavelength of outgoing light emitted from light-emitting layer of the light emitting element chip 11 has a light emission spectrum around 240 nm to 500 nm which is in the short wavelength region from the near-ultraviolet light to visible light, preferably 380 nm to 420 nm, and more preferably 450 nm to 470 nm. A light emitting element emitting light in this wavelength region is able to emit light of a desired color, in particular white light, in combination with a phosphor of various types. Alternatively, the light emitting element 10 may have a light-emitting layer made of such as ZnSe-based, InGaAs-based, or AlInGaP-based semiconductor.

Preparation of Light Transmissive Member

The light transmissive member 12 provided with a light transmissive substrate 1 and a wavelength conversion layer 2 disposed on one surface of the light transmissive substrate 1 is prepared.

Specifically, a wavelength conversion member is disposed on the light transmissive substrate, and cut into the same size as the light emitting element chip 11, for example.

Examples of the light transmissive substrate 1 include glass substrates made of quartz and borosilicate glass. A thickness of the light transmissive substrate 1 is preferably from 30 μm to 1 mm, and more preferably from 50 μm to 500 μm.

As the wavelength conversion layer 2, a binder resin mixed with a phosphor described later may be used.

The phosphor is selected from phosphors excited by light emitted from the light emitting element chip 11. If, for example, the light emitting element chip 11 is a blue light emitting element and it is desired to configure a white light emitting device, it is preferable to use a phosphor that is excited by blue light and exhibits yellow broad light emission. Examples of such a phosphor include phosphors having a cerium-activated garnet structure (in particular, a phosphor activated by cerium, containing aluminum, and having a garnet structure). As a cerium-activated phosphor exhibits yellow broad light emission, it is possible to realize white light with favorable color rendering properties in combination with blue light emission. A phosphor having a garnet structure, in particular, a phosphor containing aluminum and having a garnet structure is resistant to heat, light, and moisture, and is able to maintain yellow light emission at high brightness for an extended period of time. For example, it is preferable to use, as the phosphor, a YAG-based phosphor (generally abbreviated to YAG) expressed by $(Re_{1-x}Sm_x)_3(Al_{1-y}Ga_y)_5O_{12}$:Ce ($0 \leq x < 1$, $0 \leq y \leq 1$, where Re is at least one of elements selected from a group consisting of Y, Gd, La, Lu, and Tb). Further, other than the yellow phosphor, a phosphor such as $Si_{6-Z}Al_ZO_ZN_{8-Z}$:Eu, $Lu_3Al_5O_{12}$:Ce, $BaMgAl_{10}O_{17}$:Eu, $BaMgAl_{10}O_{17}$:Eu, Mn, (Zn, Cd)Zn:Cu, $(Sr, Ca)_{10}(PO_4)_6C_{12}$:Eu, Mn, $(Sr, Ca)_2Si_5N_8$:Eu, $CaAlSiB_xN_{3+x}$:Eu, $K_2SiF_6$:Mn, or $CaAlSiN_3$:Eu is used to adjust color rendering properties of a light source for lighting and color reproducibility in use of backlight. Alternatively, a quantum dot phosphor may also be used.

When a light emission wavelength of the light emitting element chip 11 is a short wavelength, the wavelength conversion layer 2 may include more than two types of phosphors. A first type of the phosphors may be excited by primary light from the light emitting element chip 11 to emit light, and a second type of the phosphors may be excited by secondary light emitted from the first type of the phosphors to emit light. In addition, when two types of phosphors of different chromaticity are used, by adjusting amounts of the two types of phosphors, it is possible to achieve light emission corresponding to an arbitrary chromaticity point within a region defined by connecting chromaticity point of each of the two types of phosphors and the light emitting element on a chromaticity diagram.

As the binder resin, a silicone resin or a modified silicone resin can be used. In addition, an insulating resin having light transmissivity such as an epoxy resin, a modified epoxy resin, or an acrylic resin may be used. Further, a resin having a superior weather resistance such as a hybrid resin including at least one of these resins may also be used.

Examples of a method of providing the wavelength conversion layer 2 include known methods such as printing, spray coating, compression molding, spin coat, and dispensing.

It is preferable that the wavelength conversion layer 2 be provided such that a film thickness is uniform and phosphor particles may not be eccentrically located. Among the above listed methods of providing a phosphor layer, it is preferable to use printing, spray coating, or compression molding.

Step of Arranging Light Emitting Element Chips

Figure 5A:
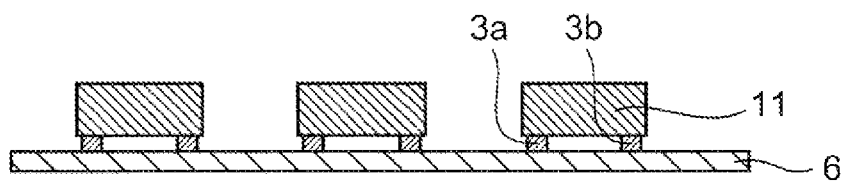
FIGS. 5A-5C are sectional views showing a process of manufacturing a light emitting element used in the light emitting device of the embodiment.

As illustrated in FIG. 5(a), light emitting element chips 11 are arranged on a sheet 6 in matrix at predetermined intervals with a surface having the positive electrode 3a and the negative electrode 3b downside. Here, the predetermined intervals at which the light emitting element chips 11 are arranged are set considering a thickness t of the reflecting layer 13. Specifically, the intervals are set to a value obtained by adding a value that is twice as large as the thickness t of the reflecting layer 13 with a cutting width that will be later described. Further, the sheet 6 is provided with an adhesive layer or a sticking layer, for example, on one surface, and the light emitting element chips 11 are maintained at the predetermined intervals by the adhesive layer or the sticking layer.

Step of Joining Light Transmissive Member

Figure 5B:
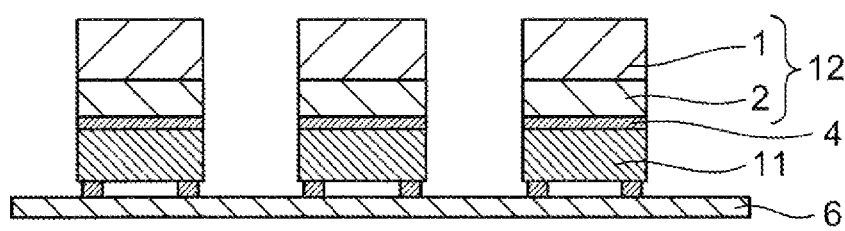

As illustrated in FIG. 5(b), the light transmissive member 12 having the wavelength conversion layer 2 is joined onto each of the light emitting element chips 11 by an adhesive member 4.

For example, the light transmissive substrate 1 is manufactured in a planar shape of a size that is the same as or slightly larger than the light emitting element chip 11, and the wavelength conversion layer 2 is joined to the light emitting element chip 11 via the adhesive member 4 made for example of a silicone resin. Through the above steps, a plurality of inner quadrangular columnar bodies each having the light emitting element chip 11 and the light transmissive member 12 are arranged on the sheet 6.

Step of Filling Resin

Figure 5C:
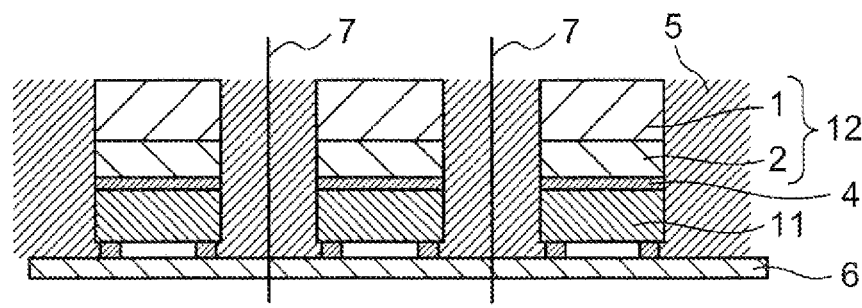

As illustrated in FIG. 5(c), a resin 5 constituting the reflecting layer 13 is applied such that the resin 5 is filled between the arranged inner quadrangular columnar bodies.

A light-reflective material is contained in the resin 5. With this, it is possible to improve light emission efficiency by reflecting light emitted from the side surfaces of the light emitting element chip 11 by the light-reflective material contained in the resin 5 toward the wavelength conversion layer 2. At least one selected from a group constituting of $TiO_2$, $ZrO_2$, $Nb_2O_5$, $Al_2O_3$, $MgF$, $AlN$, $SiO_2$, and $MgO$ may be used as the light-reflective material.

For example, the resin 5 containing the light-reflective material is filled between the arranged light emitting elements chip 11 by applying the resin 5 and spreading the resin 5 using a squeegee. At this time, the squeegee is moved along the upper surface of the light transmissive substrate 1 of the light transmissive member 12, and causes the resin 5 to fill between the light emitting element chips 11 such that the upper surface of the resin 5 and the upper surface of the light transmissive substrate 1 are positioned in the substantially same plane.

Step of Cutting

As illustrated in FIG. 5(c), after hardening the resin 5, the hardened resin 5 is cut along a cutting line 7 by dicing, for example, into individual light emitting elements. The cutting line 7 is set so as to match a center line between adjacent light emitting element chips 11, for example. A distance between the cutting line 7 and the side surface of the light emitting element chip 11 is set such that the thickness t of the reflecting layer 13 after the cutting is a predetermined thickness.

In this manner, the light emitting element 10 including the light emitting element chip 11, the light transmissive member 12 disposed on the light-emitting surface of the light emitting element chip 11, the reflecting layer 13 covering the periphery of the light emitting element chip 11 and the light transmissive member 12 is manufactured. According to the light emitting element 10 of this embodiment, a leakage of light through the side surface of the inner quadrangular prismatic body is prevented by providing the reflecting layer 13 on or over an entire side surface of the inner quadrangular prismatic body. However, the present invention is not limited to such an example. The reflecting layer may be provided on or over a part of the side surface of the inner quadrangular prismatic body to restrict the light-emitting region to a predetermined range. For example, in the step of filling the resin, the resin 5 constituting the reflecting layer 13 may be provided between the arranged inner quadrangular columnar bodies to a predetermined depth, and then the reflecting layer may be provided on or over a part of the side surface of the inner quadrangular prismatic body. Specifically, according to embodiments of the present invention, it is possible to appropriately set a region in which the reflecting layer 13 is provided on the side surface of the inner quadrangular prismatic body based on a required light extracting efficiency, the shape of the package recess, and required directional characteristics.

The light emitting element 10 thus manufactured is mounted on the recess bottom surface 24b of the base member 20 by flip-chip mounting, and thus the light emitting device according to an embodiment of the present invention is completed.

According to certain embodiments, the example in which the light transmissive member 12 is configured by the light transmissive substrate 1 and the wavelength conversion layer 2 provided on one surface of the light transmissive substrate 1 has been described. However, the present invention is not limited to such an example. For example, the light emitting element 10 may be configured by providing the wavelength conversion layer on or over the light emitting element chip 11, and providing the transparent resin layer on or over the wavelength conversion layer. Further, the light transmissive member 12 may be configured by a single resin layer containing the phosphor, or by a single resin layer containing no phosphor. Moreover, the light transmissive member 12 may be configured by a plurality of resin layers including or not including the wavelength conversion layer 2.

In the light emitting device according to embodiments of the present invention, the recess 24 housing the light emitting element 10 is provided so as to penetrate from the first surface 23a to the second surface 23b in the base member 20, and there are no upper and lower walls on the sides of the first surface 23a and the second surface 23b. Therefore, the light emitting device according to an embodiment of the present invention may be made thin.

Further, as the reflecting layer 13 is provided on or over the side surface of the light emitting element 10, it is possible to efficiently extract light from the light emitting element to the front side.

As the light emitting device according to an embodiment of the present invention thus configured has no upper and lower walls in the recess 24, it is possible to increase a ratio of a volume of the light emitting element 10 in the recess 24, and to make its size smaller and thinner. Specifically, if the recess has upper and lower walls, it is necessary to provide a gap above a predetermined level between the upper and lower walls and the light emitting elements in order to facilitate mounting of the light emitting element, the present invention does not require such an extra space for mounting. Furthermore, the upper and lower walls is required to be inclined in order to cause light from the light emitting element to be efficiently reflected to a front side in the configuration in which the reflecting layer is provided for the upper and lower walls. Therefore, it is necessary to provide a gap between the upper and lower walls and the light emitting element in order to allow the upper and lower walls to be inclined. However, with the present invention, it is not necessary to provide a gap for such a purpose. Therefore, it is not necessary to provide an extra gap in addition to the thickness of the upper and lower walls that prevents the light emitting device from being made thinner, and the light emitting device may be substantially made as thin as the thickness of the light emitting element 10.

As described above, according to embodiments of the present invention, it is possible to provide an extremely small and thin side-view type light emitting device capable of efficiently extracting light from the light emitting element to the front side.

Further, according to embodiments of the light emitting device of the present invention, the reflecting layer 13 is provided integrally with the light emitting element 10 spaced apart from the side walls of the recess, and therefore it is possible to restrict the light-emitting region to a narrower region, and effectively to a predetermined range. Here, the expression that the reflecting layer 13 is spaced apart from the side walls of the recess means that there is a distance between the reflecting layer 13 and the side walls of the recess as compared to the case in which the reflecting layer is provided for the side walls of the recess, and a part of the reflecting layer may be in contact with the side walls of the recess, for example.

Specifically, while it is difficult to restrict the light-emitting region to a region narrower than an opening of the recess with the conventional light emitting device configured such that the reflecting layer is provided for the upper and lower walls and the side walls of the recess, the light emitting device according to an embodiment of the present invention is able to restrict the light-emitting region to a desired region by appropriately setting a region in which the reflecting layer 13 is provided.

In the resin-molded body 23, the first surface 23a includes the stepped portion on each of the side of the first end surface 23d and the side of the second end surface 23e, and a reservoir for a bonding member (such as soldering) is provided on each of the sides of the first lead 21 and the second lead 22 exposed from the resin-molded body 23. With this, it is possible to prevent the light emitting device from floating when mounted, and to suppress an increase of the height when mounting.

Furthermore, the light emitting device according to embodiments of the present invention improves the heat radiation characteristics using the columnar-shaped first lead 21 and the columnar-shaped second lead 22. Specifically, if the first lead and the second lead are configured using metal flakes as in the conventional technique, the heat radiation characteristics deteriorate as the first lead and the second lead become smaller and thinner. However, the light emitting device according to embodiments of the present invention improves the heat radiation characteristics by increasing a ratio of metallic components that constitute the first lead 21 and the second lead 22 in the resin-molded body 23 using the columnar-shaped first lead 21 and the columnar-shaped second lead 22. It is preferable that the ratio of the metallic components that constitute the first lead 21 and the second lead 22 in the resin-molded body 23 is as high as possible. This is because both the heat radiation characteristics and facility for implementation are improved as the ratio of the leads increases.

Further, in the resin-molded body 23, the first surface 23a includes the stepped portion on each of the side of the first end surface 23d and the side of the second end surface 23e, and an area of the first lead 21 and the second lead 22 exposed from the resin-molded body 23 on the side of the first end surface 23d and on the side of the second end surface 23e is increased. With this, it is possible to more effectively radiate heat in an actual implementation.

What is claimed is:

1. A light emitting device comprising:
   a base member comprising:
   a pair of leads; and
   a resin-molded body integrated with the pair of leads,
   wherein the base member has an upper surface, a lower surface opposed to the upper surface, a first side surface, a second side surface opposed to the first side surface, a third side surface, and a fourth side surface opposed to the third surface, and wherein a recess is on the upper surface, the recess having a pair of continuous sloping side walls opposed to each other and a bottom surface on which the pair of leads are disposed, and the recess being opened on the third side surface and the fourth side surface; and
   a light emitting element comprising:
   a light emitting element chip;
   a light transmissive member disposed on or over an upper surface of the light emitting element chip and comprising a light transmissive substrate; and
   a reflecting layer covering a periphery of the light emitting element chip and the light transmissive member,
   wherein the light emitting element is disposed on the bottom surface of the recess, and
   wherein the reflecting layer is spaced apart from the pair of continuous sloping side walls of the recess.

2. The light emitting device according to claim 1, wherein the base member further comprises a first dent opened at the first side surface and the third side surface and a second dent opened at the second side surface and the third side surface.

3. The light emitting device according to claim 1, wherein the pair of continuous sloping side walls of the recess are inclined such that an opening side of the recess is greater than the bottom surface of the recess.

4. The light emitting device according to claim 1, wherein a planar shape of the light transmissive substrate is larger in size than that of the light emitting element chip.

5. The light emitting device according to claim 1, wherein the light transmissive member comprises a wavelength conversion layer disposed on one surface of the light emitting element chip side.

6. The light emitting device according to claim 5, wherein the wavelength conversion layer is disposed on the light emitting element chip via an adhesive member.

7. The light emitting device according to claim 1,
   wherein the base member further comprises a first dent opened at the first side surface and the third side surface and a second dent opened at the second side surface and the third side surface, and wherein the pair of continuous sloping side walls of the recess are inclined such that an opening side of the recess is greater than the bottom surface of the recess.

8. The light emitting device according to claim 1,
wherein the base member further comprises a first dent opened at the first side surface and the third side surface and a second dent opened at the second side surface and the third side surface, and
wherein a planar shape of the light transmissive substrate is larger in size than that of the light emitting element chip.

9. The light emitting device according to claim 1,
wherein the base member further comprises a first dent opened at the first side surface and the third side surface and a second dent opened at the second side surface and the third side surface, and
wherein the light transmissive member comprises a wavelength conversion layer disposed on one surface of the light emitting element chip side.

10. The light emitting device according to claim 1,
wherein the base member further comprises a first dent opened at the first side surface and the third side surface and a second dent opened at the second side surface and the third side surface,
wherein the light transmissive member comprises a wavelength conversion layer disposed on one surface of the light emitting element chip side, and
wherein the wavelength conversion layer is disposed on the light emitting element chip via an adhesive member.

11. The light emitting device according to claim 1,
wherein the base member further comprises a first dent opened at the first side surface and the third side surface and a second dent opened at the second side surface and the third side surface,
wherein the pair of continuous sloping side walls of the recess are inclined such that an opening side of the recess is greater than the bottom surface of the recess, and
wherein a planar shape of the light transmissive substrate is larger in size than that of the light emitting element chip.

12. The light emitting device according to claim 1,
wherein the base member further comprises a first dent opened at the first side surface and the third side surface and a second dent opened at the second side surface and the third side surface,
wherein the pair of continuous sloping side walls of the recess are inclined such that an opening side of the recess is greater than the bottom surface of the recess, and
wherein the light transmissive member comprises a wavelength conversion layer disposed on one surface of the light emitting element chip side.

13. The light emitting device according to claim 1,
wherein the base member further comprises a first dent opened at the first side surface and the third side surface and a second dent opened at the second side surface and the third side surface,
wherein the pair of continuous sloping side walls of the recess are inclined such that an opening side of the recess is greater than the bottom surface of the recess,
wherein the light transmissive member comprises a wavelength conversion layer disposed on one surface of the light emitting element chip side, and
wherein the wavelength conversion layer is disposed on the light emitting element chip via an adhesive member.

14. The light emitting device according to claim 1,
wherein the base member further comprises a first dent opened at the first side surface and the third side surface and a second dent opened at the second side surface and the third side surface,
wherein the pair of continuous sloping side walls of the recess are inclined such that an opening side of the recess is greater than the bottom surface of the recess,
wherein a planar shape of the light transmissive substrate is larger in size than that of the light emitting element chip, and
wherein the light transmissive member comprises a wavelength conversion layer disposed on one surface of the light emitting element chip side.

15. The light emitting device according to claim 1,
wherein the base member further comprises a first dent opened at the first side surface and the third side surface and a second dent opened at the second side surface and the third side surface,
wherein the pair of continuous sloping side walls of the recess are inclined such that an opening side of the recess is greater than the bottom surface of the recess,
wherein a planar shape of the light transmissive substrate is larger in size than that of the light emitting element chip,
wherein the light transmissive member comprises a wavelength conversion layer disposed on one surface of the light emitting element chip side, and
wherein the wavelength conversion layer is disposed on the light emitting element chip via an adhesive member.

* * * * *